(12) United States Patent
Kurita et al.

(10) Patent No.: US 11,685,087 B2
(45) Date of Patent: Jun. 27, 2023

(54) CONDUCTIVE MEMBER MODULE, AND PRODUCTION METHOD THEREFOR

(71) Applicant: DENSO CORPORATION, Kariya (JP)

(72) Inventors: Akifumi Kurita, Kariya (JP); Yohei Yoshimura, Kariya (JP); Ryota Tanabe, Kariya (JP)

(73) Assignee: DENSO CORPORATION, Kariya (JP)

( * ) Notice: Subject to any disclaimer, the term of this patent is extended or adjusted under 35 U.S.C. 154(b) by 393 days.

(21) Appl. No.: 16/866,373

(22) Filed: May 4, 2020

(65) Prior Publication Data

US 2020/0262114 A1    Aug. 20, 2020

Related U.S. Application Data

(63) Continuation of application No. PCT/JP2018/040941, filed on Nov. 5, 2018.

(30) Foreign Application Priority Data

Nov. 6, 2017 (JP) .............................. JP2017-214117

(51) Int. Cl.
  *B29C 45/14* (2006.01)
  *B29L 31/34* (2006.01)
  *H01L 25/16* (2023.01)
  *H02M 7/5387* (2007.01)

(52) U.S. Cl.
  CPC ..... *B29C 45/14467* (2013.01); *B29L 2031/34* (2013.01); *H01L 25/16* (2013.01); *H02M 7/5387* (2013.01)

(58) Field of Classification Search
  None
  See application file for complete search history.

(56) References Cited

FOREIGN PATENT DOCUMENTS

JP         5446722 B2      3/2014

*Primary Examiner* — Long Pham
(74) *Attorney, Agent, or Firm* — Harness, Dickey & Pierce, P.L.C.

(57) ABSTRACT

A conductive member module has a pair of conductive members formed in a plate shape and facing each other, and a sealing part. The conductive member module is produced by performing an accommodation step, a sealing step, and an extraction step. In the accommodation step, the two individual conductive members are sandwiched in the facing orientation thereof by outer support members abutting outer surfaces of the conductive members, and inner support members abutting inner surfaces of the conductive members. Outer recesses are formed in the outer surfaces by the outer support members, and inner recesses are formed in the inner surfaces by the inner support members. The outer recesses are deeper in the Z direction than the inner recesses.

4 Claims, 23 Drawing Sheets

CONDUCTIVE MEMBER MODULE, AND PRODUCTION METHOD THEREFOR

CROSS-REFERENCE OF RELATED APPLICATION

The present application is the U.S. bypass application of International Application No. PCT/JP2018/040941 filed Nov. 5, 2018 which designated the U.S. and claims priority to Japanese Patent Application No. 2017-214117, filed Nov. 6, 2017, the contents of which are incorporated herein by reference.

BACKGROUND

Technical Field

The present disclosure relates to a conductive member module having a pair of conductive members facing each other, and a sealing part for sealing the pair of conductive members, and also relates to a method for producing the same.

A conductive member module having a pair of conductive members facing each other, and a sealing part for sealing the pair of conductive members is known as a component used in electrical devices etc. In the production of such a conductive member module, a pair of conductive members are first accommodated in a molding die (accommodation step), and a resin is injected into the die to seal the pair of conductive members (sealing step). After the resin is solidified, the conductive member module is extracted from the die (extraction step).

SUMMARY

A first aspect of the present disclosure is a method for producing a conductive member module having a pair of conductive members formed in a plate shape and facing each other, and a sealing part for sealing the pair of conductive members, the method comprising performing: an accommodation step of accommodating the pair of conductive members in a molding die in a state of being separated from each other, a sealing step of injecting a fluid resin into the die to seal the pair of conductive members, and an extraction step of extracting the conductive member module from the die.

BRIEF DESCRIPTION OF THE DRAWINGS

The above and other objects, features, and advantages of the present disclosure will become clearer from the following detailed description with reference to the accompanying drawings.

In the accompanying drawings.

DETAILED DESCRIPTION OF THE PREFERRED EMBODIMENTS

According to a conventional conductive member module, for example, disclosed by Japanese patent No. 5446722, in the production of such a conductive member module, a pair of conductive members are first accommodated in a molding die (accommodation step), and a resin is injected into the die to seal the pair of conductive members (sealing step). After the resin is solidified, the conductive member module is extracted from the die (extraction step).

Figure 26:
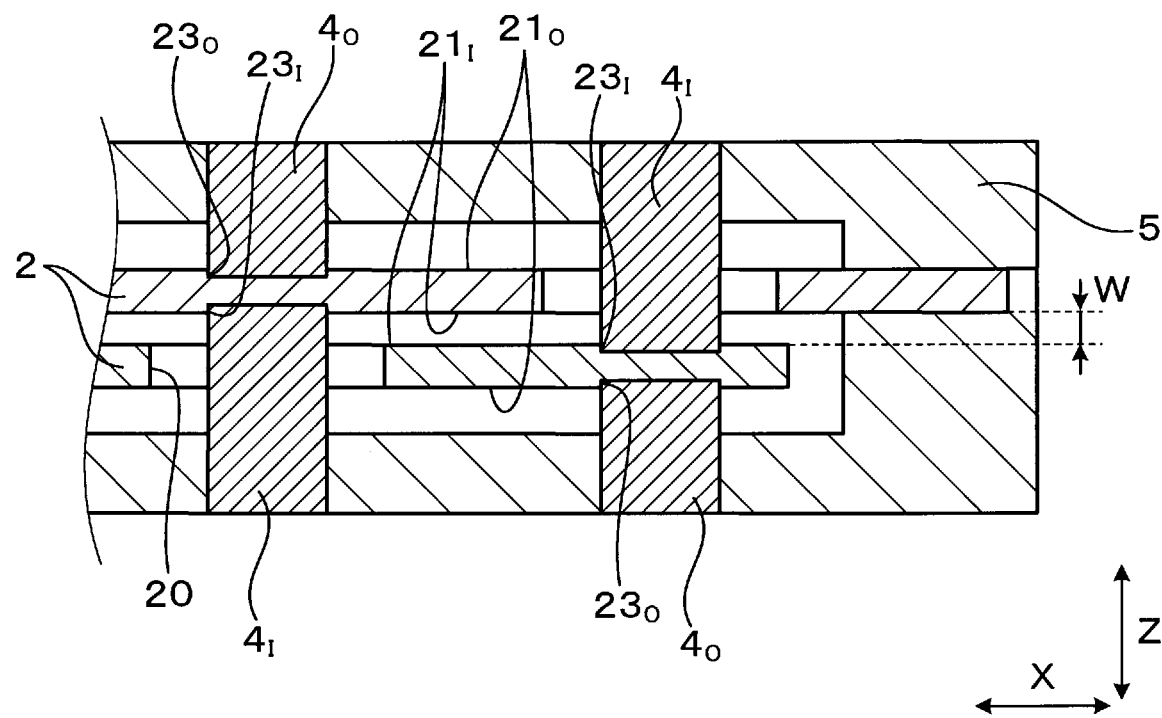
FIG. 26 is an explanatory view of a method for producing a conductive member module in a comparative embodiment.

In the accommodation step, a pair of support members are used to sandwich the individual conductive members from a facing orientation of the pair of conductive members (see FIG. 26). The conductive members are thereby fixed in the die, and the conductive members do not move greatly due to the resin injected in the sealing step. This suppresses the problems that the pair of conductive members get closer and come into contact with each other, and that the distance between the pair of conductive members varies to change the parasitic inductance between them.

In the method for producing a conductive member module, product variations were likely to occur in the distance between a pair of conductive members. That is, if the thickness of the conductive members varies, the distance between the pair of conductive members varies. In the method for producing a conductive member module, no measure is taken to suppress the variation of the distance between the pair of conductive members, which occurs when the thickness of the conductive members varies.

Therefore, the variation of the distance between the pair of conductive members increases, and the parasitic inductance between these conductive members is likely to vary.

Hereinafter, with reference to the drawings, embodiments of the present disclosure will be described.

First Embodiment

Figure 1:
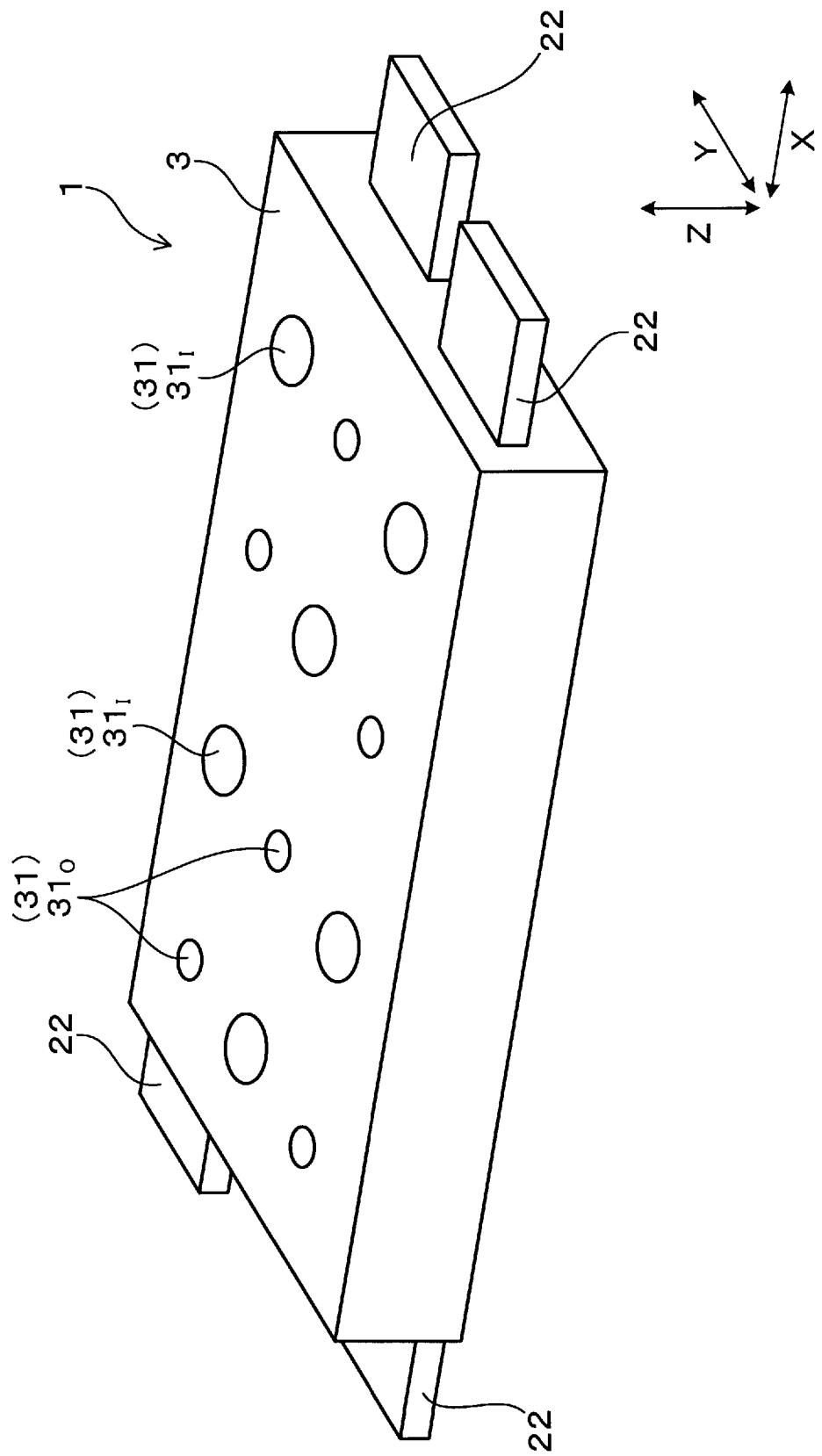
FIG. 1 is a perspective view of a conductive member module in a first embodiment.
Figure 2:
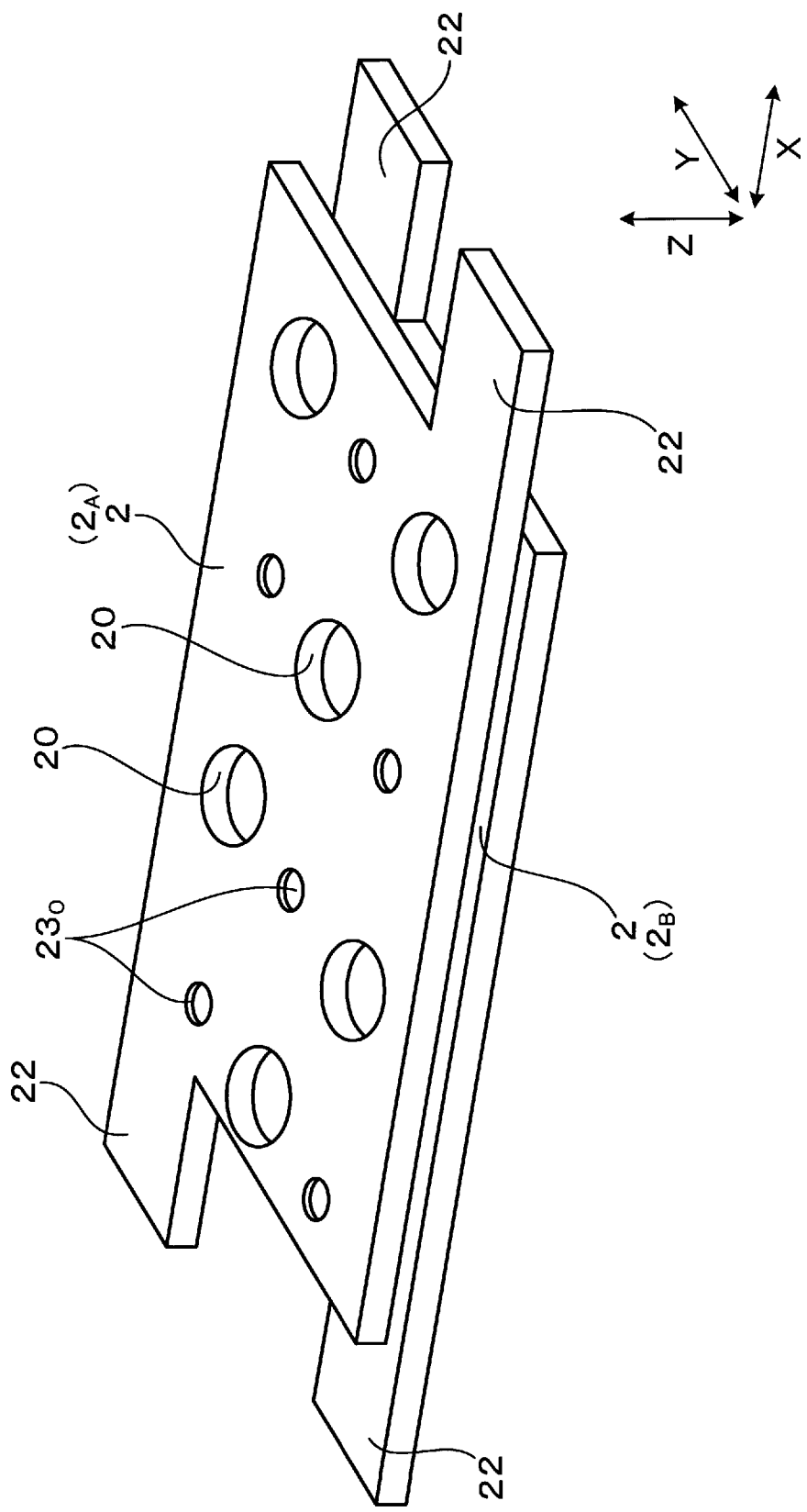
FIG. 2 is a perspective view of conductive members in the first embodiment.

Embodiments relating to the conductive member module and the method for producing the same are described with reference to FIGS. 1 to 14. As shown in FIGS. 1 and 2, the conductive member module 1 of the present embodiment has a pair of conductive members 2 formed in a plate shape and facing each other, and a sealing part 3 for sealing the pair of conductive members 2. In the present embodiment, the conductive member module 1 is produced by performing an accommodation step (see FIGS. 3 to 5), a sealing step (see FIGS. 6 and 7), and an extraction step (see FIGS. 8 and 9).

Figure 3:
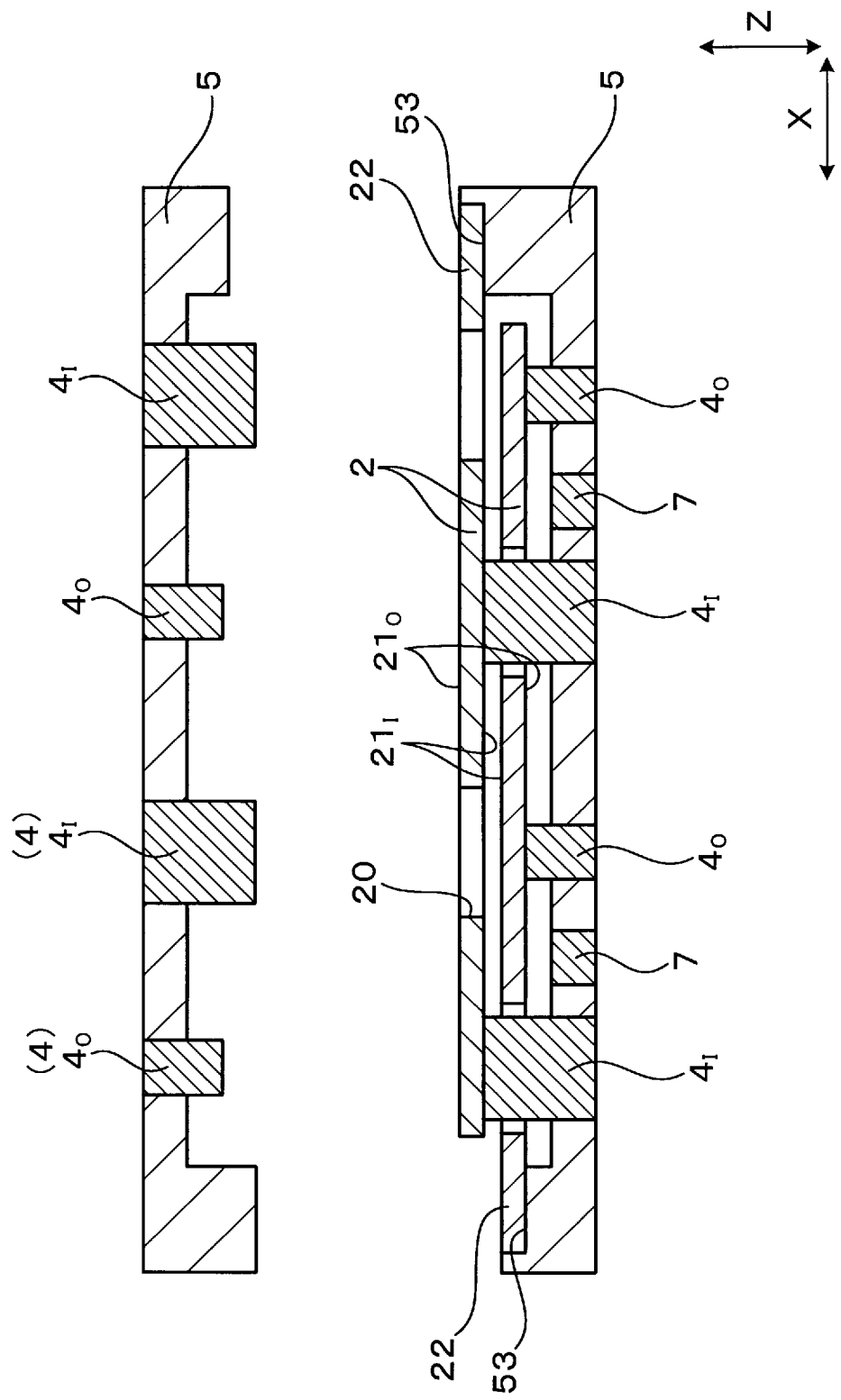
FIG. 3 is an explanatory view of a method for producing the conductive member module in the first embodiment.
Figure 4:
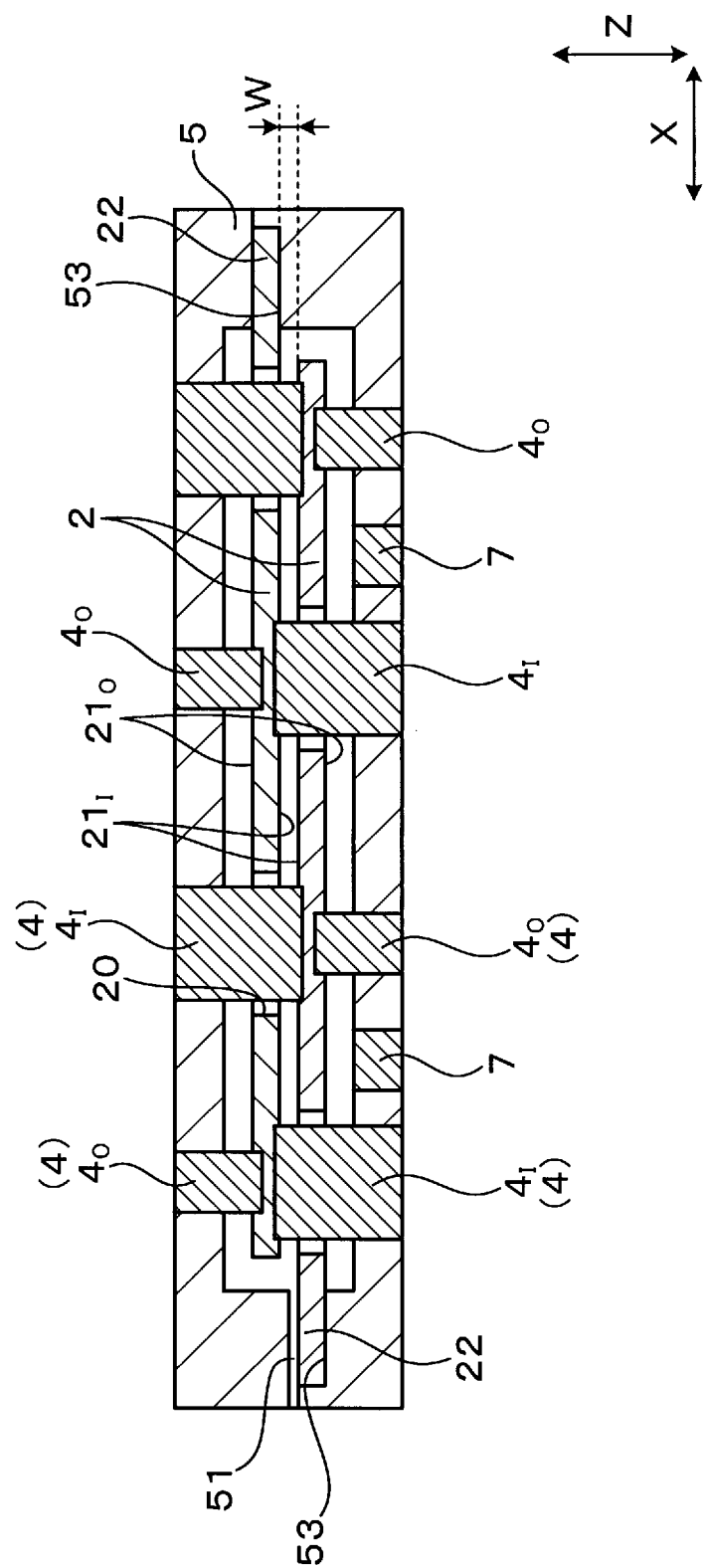
FIG. 4 is an explanatory view of the production method following FIG. 3.
Figure 5:
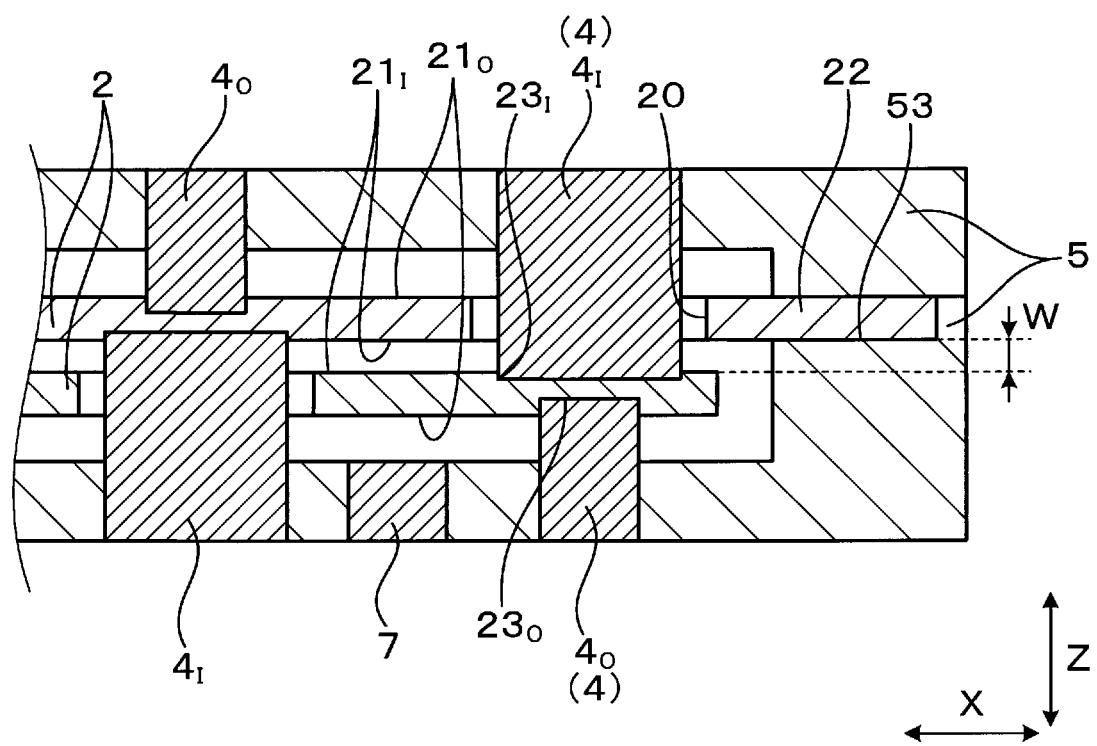
FIG. 5 is a partially enlarged view of FIG. 4.

As shown in FIGS. 3 to 5, in the accommodation step, the pair of conductive members 2 are accommodated in a molding die 5 in a state of being separated from each other.

Figure 6:
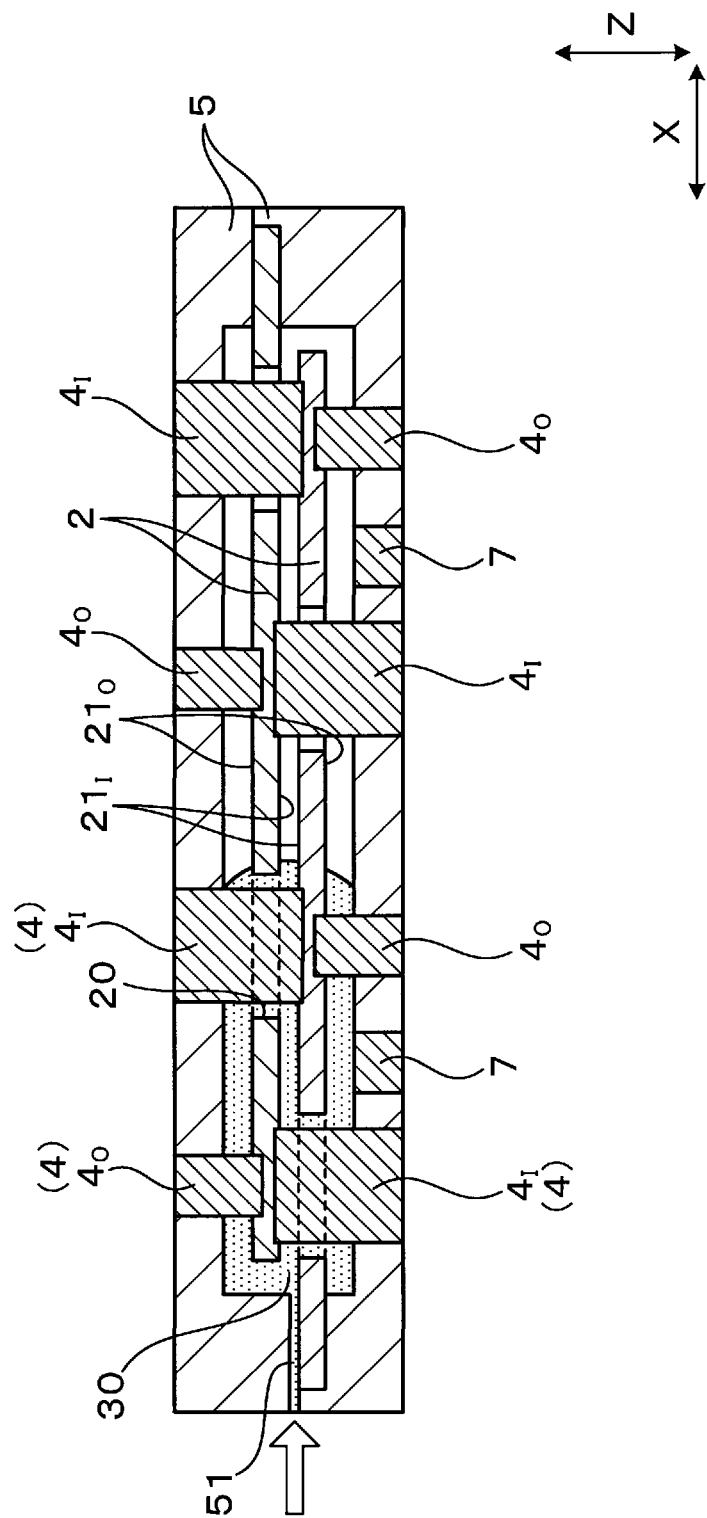
FIG. 6 is an explanatory view of the production method following FIG. 4.
Figure 7:
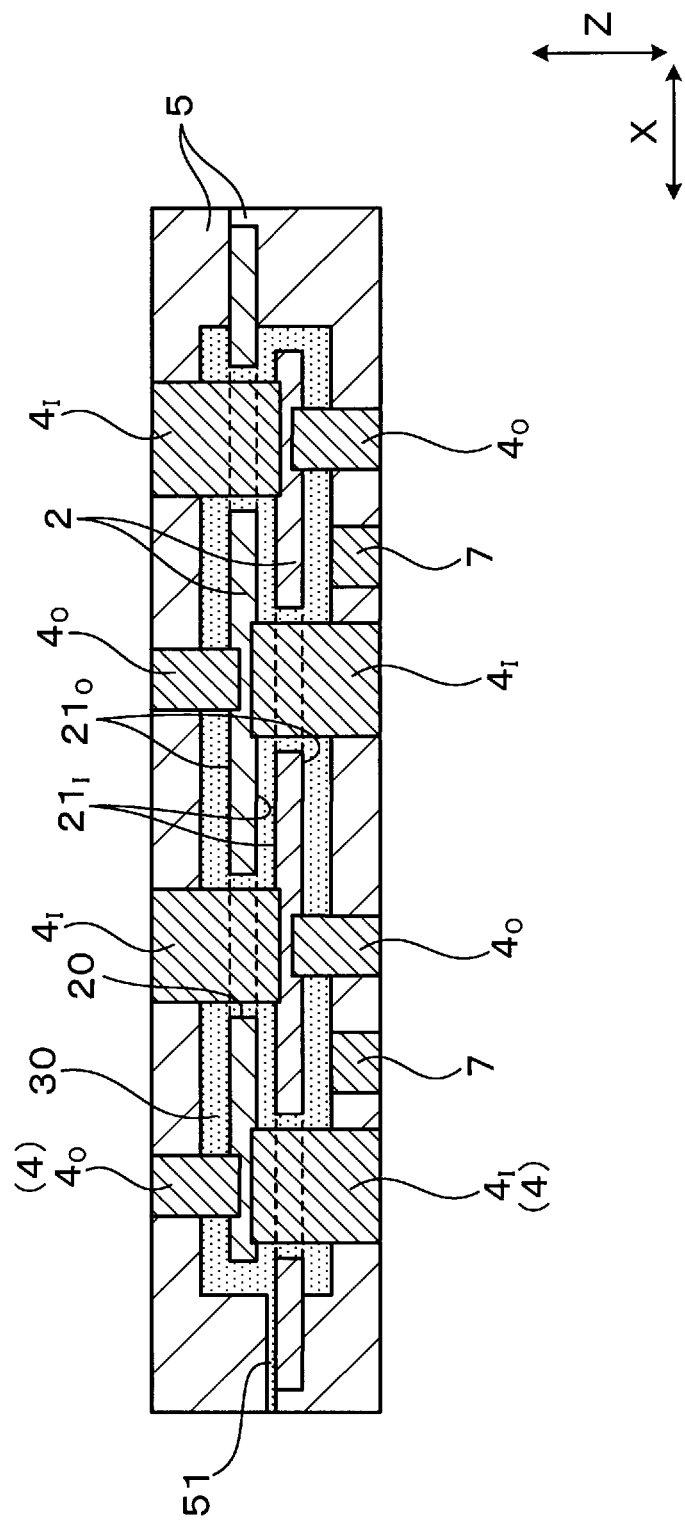
FIG. 7 is an explanatory view of the production method following FIG. 6.

Further, as shown in FIGS. 6 and 7, in the sealing step, a fluid resin 30 is injected into the die 5 to seal the pair of conductive members 2.

Figure 8:
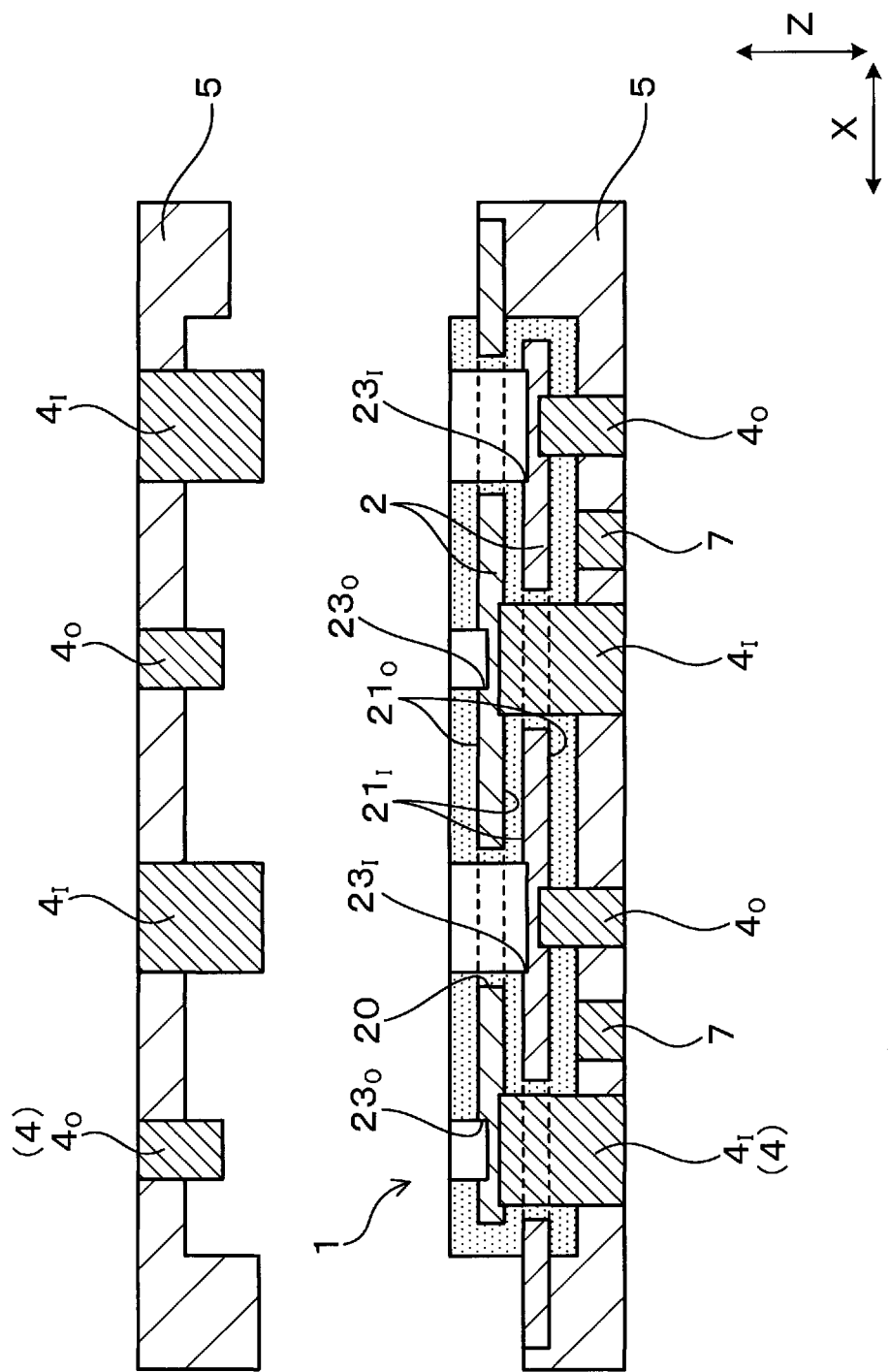
FIG. 8 is an explanatory view of the production method following FIG. 7.
Figure 9:
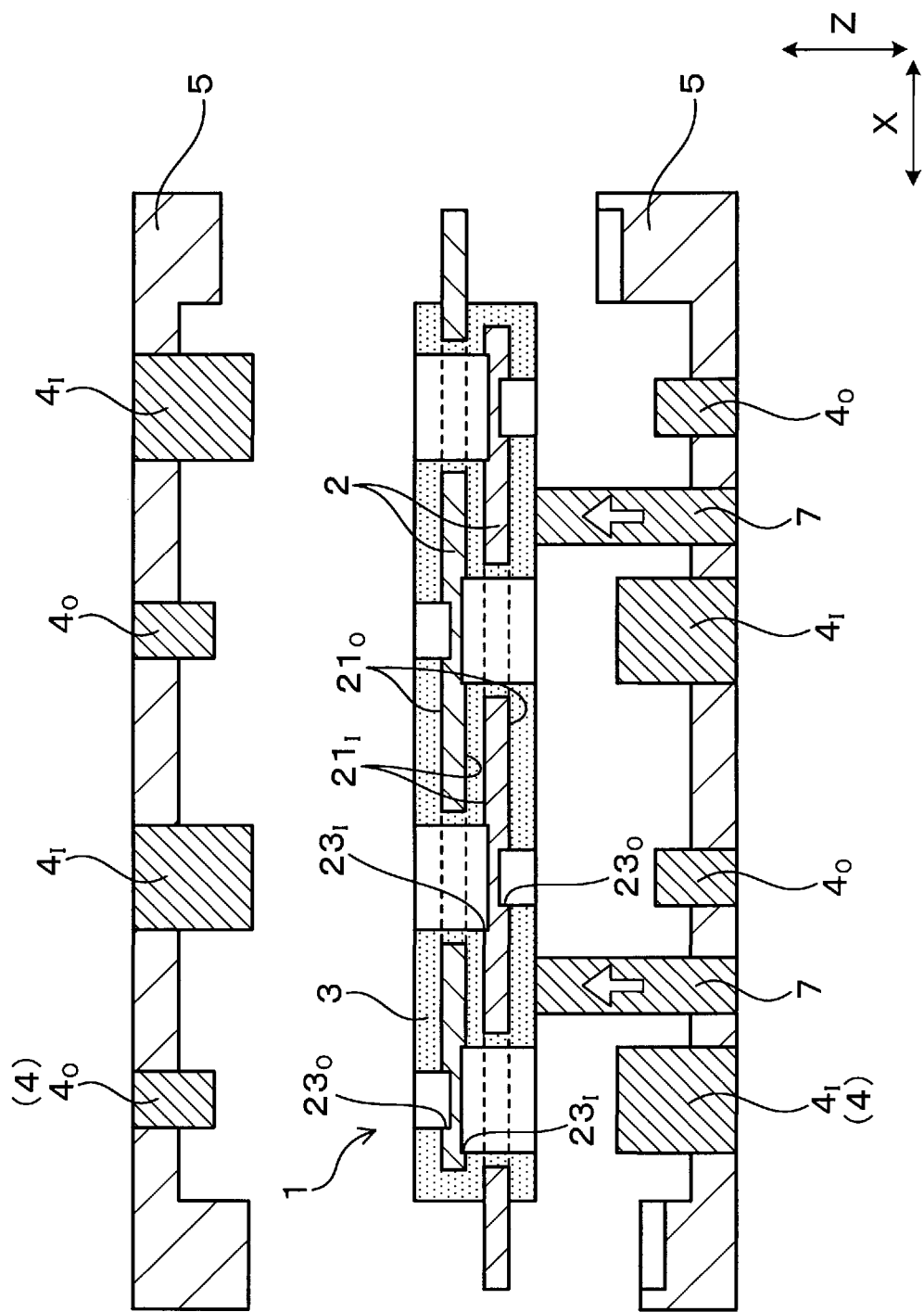
FIG. 9 is an explanatory view of the production method following FIG. 8.

As shown in FIGS. 8 and 9, in the extraction step, the conductive member module 1 is extracted from the die 5.

As shown in FIGS. 3 to 5, in the accommodation step, the individual conductive members 2 are held in the die 5 while they are sandwiched in a facing orientation (Z direction) of the pair of conductive members 2 by outer support members $4_O$ abutting outer surfaces $21_O$ of the conductive members 2 in the Z direction, and inner support members $4_I$ abutting inner surfaces $21_I$ of the conductive members 2 in the Z direction.

In the accommodation step, outer recesses $23_O$ are formed in the outer surfaces $21_O$ by the outer support members $4_O$. Further, inner recesses $23_I$ are formed in the inner surfaces $21_I$ by the inner support members $4_I$. The outer recesses $23_O$ are deeper in the Z direction than inner recesses $23_I$.

The □inner surface $21_I$□means, of the two surfaces 21 ($21_I$ and $21_O$) of each conductive member 2 orthogonal to the Z direction, one on which the other conductive member 2 is disposed. Further, the □outer surface $21_O$□means a surface formed on the side opposite to the inner surface $21_I$.

Figure 12:
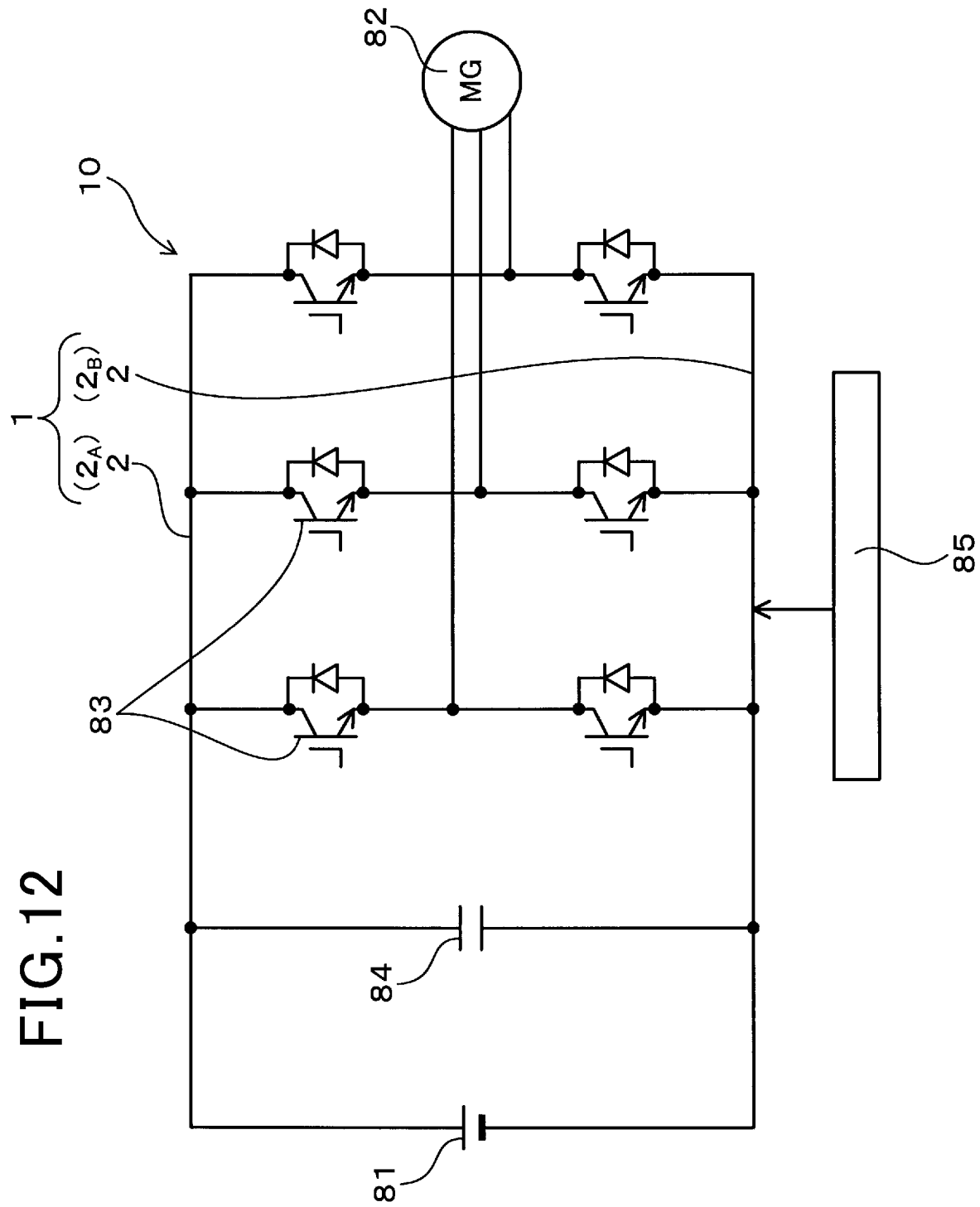
FIG. 12 is a circuit diagram of a power conversion device using the conductive member module in the first embodiment.

As shown in FIG. 12, in the present embodiment, the conductive member module 1 is used in a power conversion device 10. The power conversion device 10 comprises a smoothing capacitor 84 and a plurality of switching elements 83. The capacitor 84 and the switching elements 83 are electrically connected using the conductive members 2 in the conductive member module 1. The power conversion device 10 uses a control unit 85 to turn on and off the switching elements 83. A DC power supplied from a DC power supply 81 is thereby converted into an AC power to drive a three-phase AC motor 82.

As shown in FIGS. 3 to 5, in the accommodation step, the pair of conductive members 2 are accommodated in the die 5. Connection terminals 22 of the conductive members 2 are sandwiched by the die 5 on split surfaces 53 of the die 5.

The conductive members 2 are each provided with a plurality of through holes 20 penetrating in the Z direction. Further, the inner support members $4_I$ and the outer support members $4_O$ are attached to the die 5. In the accommodation step, the inner support members $4_I$ are inserted into the through holes 20 and brought into contact with the inner surfaces $21_I$ of the conductive members 2. Further, the outer support members $4_O$ are brought into contact with the outer surfaces $21_O$ of the conductive members 2. In this manner, the conductive members 2 are sandwiched in the Z direction using the inner support members $4_I$ and the outer support members $4_O$. As shown in FIG. 5, due to the force applied at this time, the outer recesses $23_O$ are formed in the outer surfaces $21_O$, and the inner recesses $23_I$ are formed in the inner surfaces $21_I$.

Figure 13:
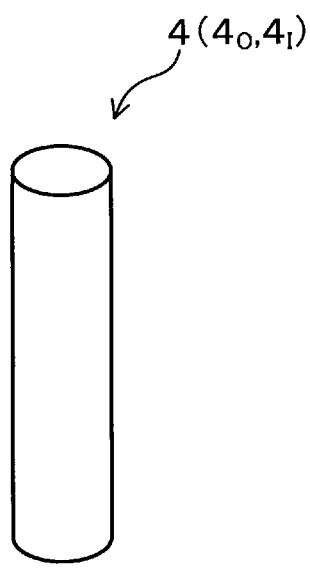
FIG. 13 is a perspective view of a support member in the first embodiment.

In the present embodiment, the outer support member $4_O$ and the inner support member $4_I$ are each formed in a cylindrical shape (see FIG. 13). The outer support member $4_O$ is formed thinner than the inner support member $4_I$. Accordingly, the pressure applied to the outer surface $21_O$ by the outer support member $4_O$ is higher than the pressure applied to the inner surface $21_I$ by the inner support member $4_I$. Therefore, the outer recess $23_O$ is formed deeper than the inner recess $23_I$.

After the accommodation step is performed, a resin 30 is injected from a gate 51 to seal the pair of conductive members 2, as shown in FIGS. 6 and 7. In this case, a force is applied to the conductive members 2 from the resin 30 in the Z direction. However, in the present embodiment, the conductive members 2 are sandwiched in the Z direction by a pair of support members 4 ($4_I$ and $4_O$); thus, the conductive members 2 can be prevented from moving in the Z direction. This can prevent the problem that the pair of conductive members 2 get closer and come into contact with each other.

After the sealing step is performed, a step of extracting the conductive member module 1 from the die 5 (extraction step) is performed, as shown in FIGS. 8 and 9. In the extraction step, the die 5 is opened, and release pins 7 are pushed out. The conductive member module 1 is thereby released from the die 5.

Figure 10:
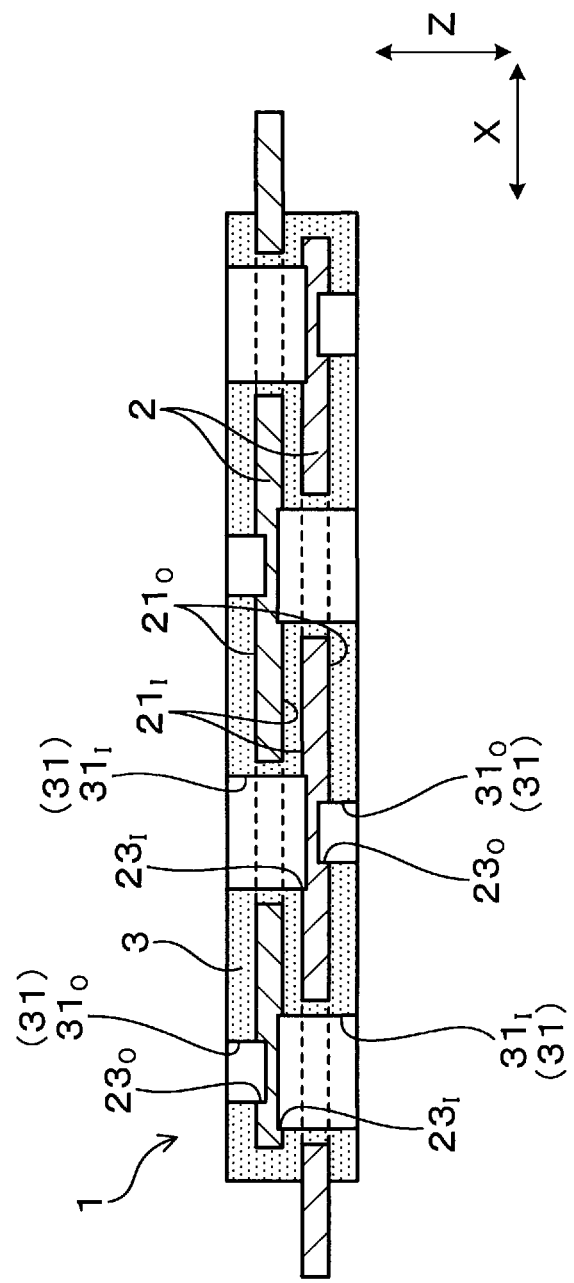
FIG. 10 is a cross-sectional view of the conductive member module in the first embodiment.
Figure 11:
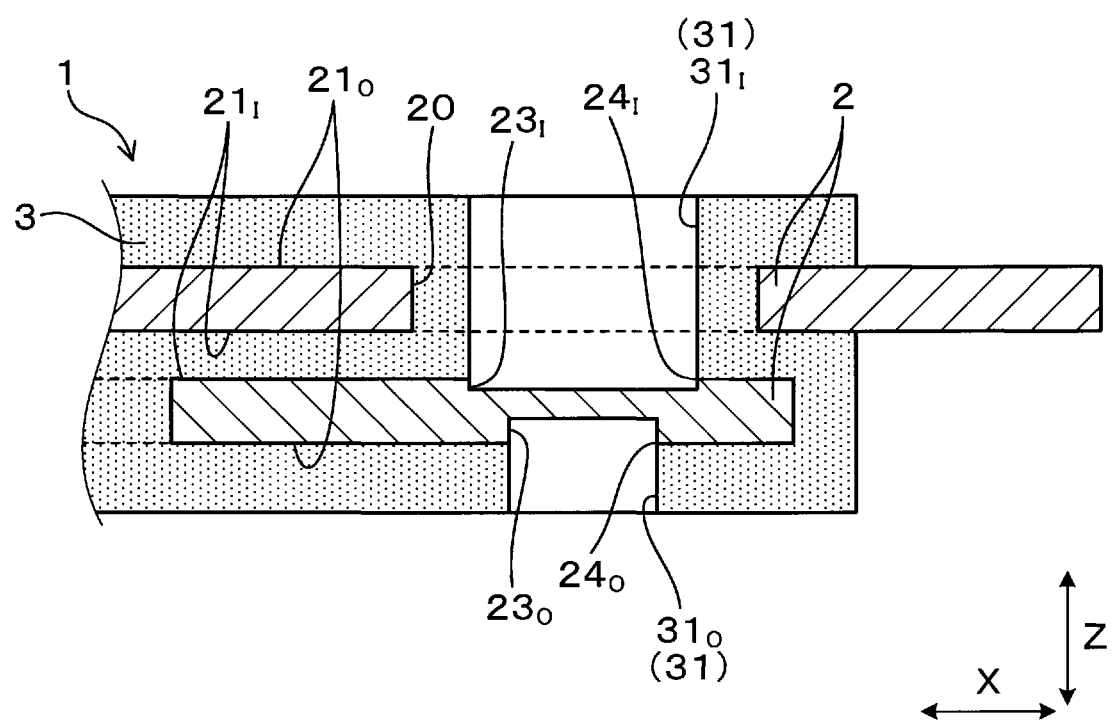
FIG. 11 is a partially enlarged view of FIG. 10.

FIGS. 10 and 11 show cross-sectional views of the produced conductive member module 1. As shown in these figures, the conductive member module 1 comprises a pair of conductive members 2 and a sealing part 3 for sealing the conductive members 2. Outer recesses $23_O$ are formed in outer surfaces $21_O$ of the individual conductive members 2, and inner recesses $23_I$ are formed in inner surfaces $21_I$ thereof. The outer recesses $23_O$ are deeper in the Z direction than the inner recesses $23_I$.

Further, outer through holes $31_O$ are formed in the positions in which the outer support members $4_O$ are arranged during production. The outer through holes $31_O$ penetrate part of the sealing part 3 in the Z direction, and are connected to the outer recesses $23_O$ from opening $24_O$ sides. Further, inner through holes $31_I$ are formed in the positions in which the inner support members $4_I$ are arranged. The inner through holes $31_I$ penetrate part of the sealing part 3 in the Z direction, and are connected to the inner recesses $23_I$ from opening $24_I$ sides.

The working effects of the present embodiment will be described. In the present embodiment, as shown in FIGS. 3 to 5, the individual conductive members 2 are sandwiched in the Z direction using outer support members $4_O$ and inner support members $4_I$ in the accommodation step. Outer recesses $23_O$ are formed by the outer support members $4_O$ in outer surfaces $21_O$ of the conductive members 2. Further, inner recesses $23_I$ are formed by the inner support members $4_I$ in inner surfaces $21_I$. The outer recesses $23_O$ are deeper in the Z direction than the inner recesses $23_I$.

Accordingly, even if the thickness of the conductive members 2 varies, the variation of the thickness can be absorbed by the outer recesses $23_O$. Therefore, the large variation of the distance W between the pair of conductive members 2 can be suppressed. Consequently, the variation of the parasitic inductance between the pair of conductive members 2 can be reduced.

That is, as shown in FIG. 26, in a conventional method for producing a conductive member module 1, the outer support members $4_O$ and the inner support members $4_I$ had the same thickness. Accordingly, the inner recesses $23_I$ and the outer recesses $23_O$ had substantially the same depth in the Z direction. Therefore, for example, when the thickness of the conductive members 2 was increased due to production variations, the inner recesses $23_I$ were recessed as deeply as the outer recesses $23_O$, and the distance W between the inner surfaces $21_I$ of the pair of conductive members 2 was narrowed. Accordingly, the parasitic inductance between the pair of conductive members 2 was low. Moreover, when the thickness of the conductive members 2 was reduced due to production variations, the inner recesses $23_I$ were recessed as slightly as the outer recesses $23_O$, and the distance W between the inner surfaces $21_I$ of the pair of conductive members 2 was widened. Accordingly, the inductance between the pair of conductive members 2 was high. Thus, when the inner recesses $23_I$ and the outer recesses $23_O$ have the same depth, if the thickness of the conductive members 2 varies, the recess of the inner recesses $23_I$ is likely to vary significantly. Therefore, the distance W between the pair of inner surfaces $21_I$ is likely to vary, and the inductance is also likely to vary.

In contrast, as in the present embodiment, when the amount of recess of the outer recesses $23_O$ is larger than that of the inner recesses $23_I$, as shown in FIG. 5, even if the thickness of the conductive members 2 varies, the variation of the thickness can be absorbed by the outer recesses $23_O$, and the variation of the recess of the inner recesses $23_I$ can be reduced. Therefore, the large variation of the distance W between the inner surfaces $21_I$ of the pair of conductive members 2 can be suppressed, and the variation of the inductance between the pair of conductive members 2 can be suppressed.

Further, in the present embodiment, the outer recesses $23_O$ have a smaller area when viewed from the Z direction than that of the inner recesses $23_I$.

Accordingly, in the accommodation step, a higher pressure can be applied to the outer recesses $23_O$ than to the inner recesses $23_I$. Therefore, the outer recesses $23_O$ can be recessed more deeply than the inner recesses $23_I$. Consequently, even if the thickness of the conductive members 2 varies, significant variation of the distance W between the pair of conductive members 2 can be suppressed.

Moreover, in the present embodiment, the outer support members $4_O$ and the inner support members $4_I$ are formed separately from the die 5.

Therefore, these support members $4_O$ and $4_I$ can be easily replaced when their tips are worn.

As described above, the present embodiment makes it possible to provide a conductive member module in which the distance between a pair of conductive members is less likely to vary even if the thickness of the conductive members varies, and to also provide a method for producing the same.

Figure 14:
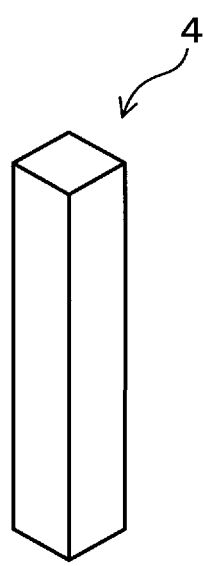
FIG. 14 is a perspective view of a support member formed in a prismatic shape in the first embodiment.

In the present embodiment, the outer support members $4_O$ and the inner support members $4_I$ are formed in a cylindrical shape, as shown in FIG. 13; however, the present disclosure is not limited thereto. For example, these members may be formed in a prismatic shape, as shown in FIG. 14.

In the following embodiments, among the reference numerals used in the drawings, those that are the same as the reference numerals used in First embodiment represent the same constituents as those of First embodiment, unless otherwise indicated.

Second Embodiment

Figure 18:
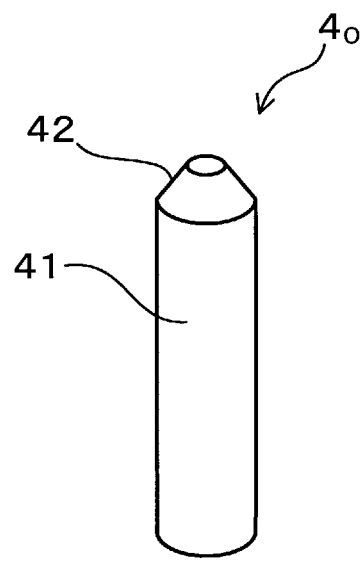
FIG. 18 is a perspective view of a support member in the second embodiment.

The present embodiment is an example in which the shape of the outer support members $4_O$ is changed. As shown in FIG. 18, the outer support members $4_O$ of the present embodiment each comprise a main part 41 and a tip 42. The main part 41 has substantially the same thickness as the inner support member $4_I$ (see FIG. 15). The tip 42 is formed in a truncated cone shape.

Figure 15:
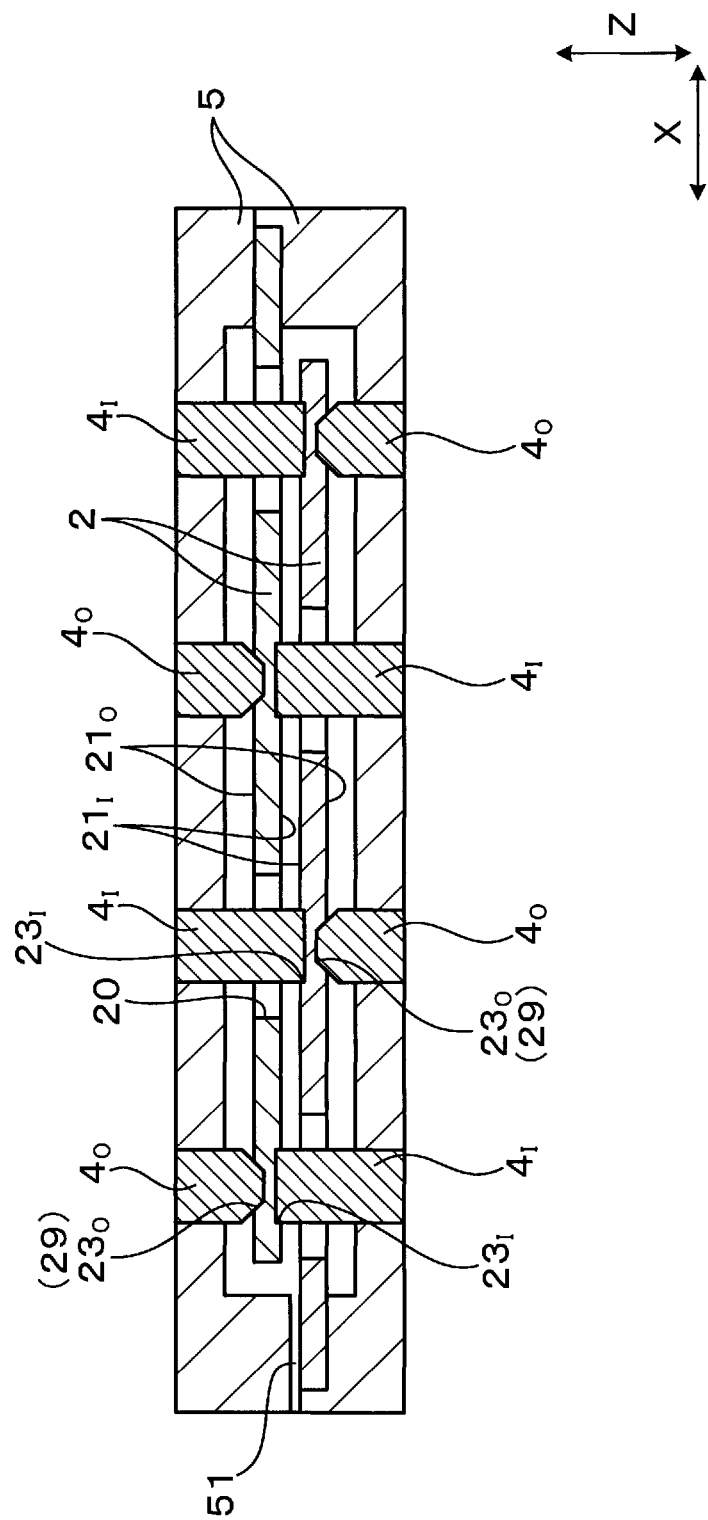
FIG. 15 is an explanatory view of a method for producing a conductive member module in a second embodiment.

As shown in FIG. 15, in the accommodation step, the conductive members 2 are sandwiched in the Z direction using the outer support members $4_O$ and inner support members $4_I$. Outer recesses $23_O$ are formed by the outer support members $4_O$, and inner recesses $23_I$ are formed by the inner support members $4_I$. In the present embodiment, the tip 42 of the outer support member $4_O$ (see FIG. 18) has a truncated cone shape, and the outer recess $23_O$ thus has a tapered inner peripheral surface 29 (see FIG. 17). More specifically, the inner peripheral surface 29 of the outer recess $23_O$ is inclined so as to approach the center of the outer recess $23_O$ toward the inner surface $21_I$ side in the Z direction.

Figure 16:
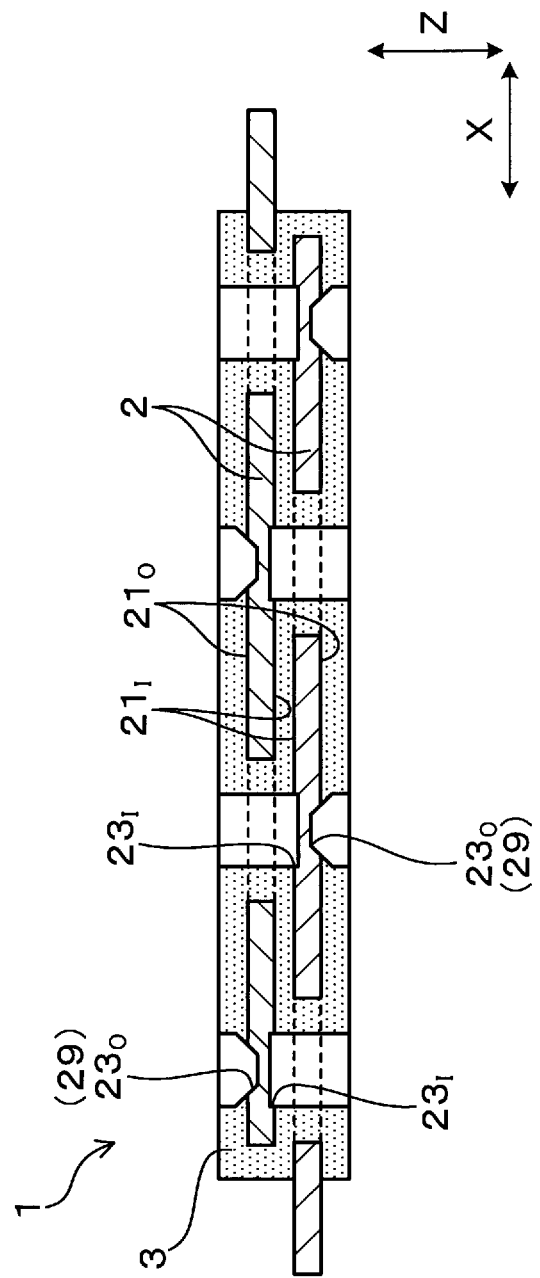
FIG. 16 is a cross-sectional view of the conductive member module in the second embodiment.
Figure 17:
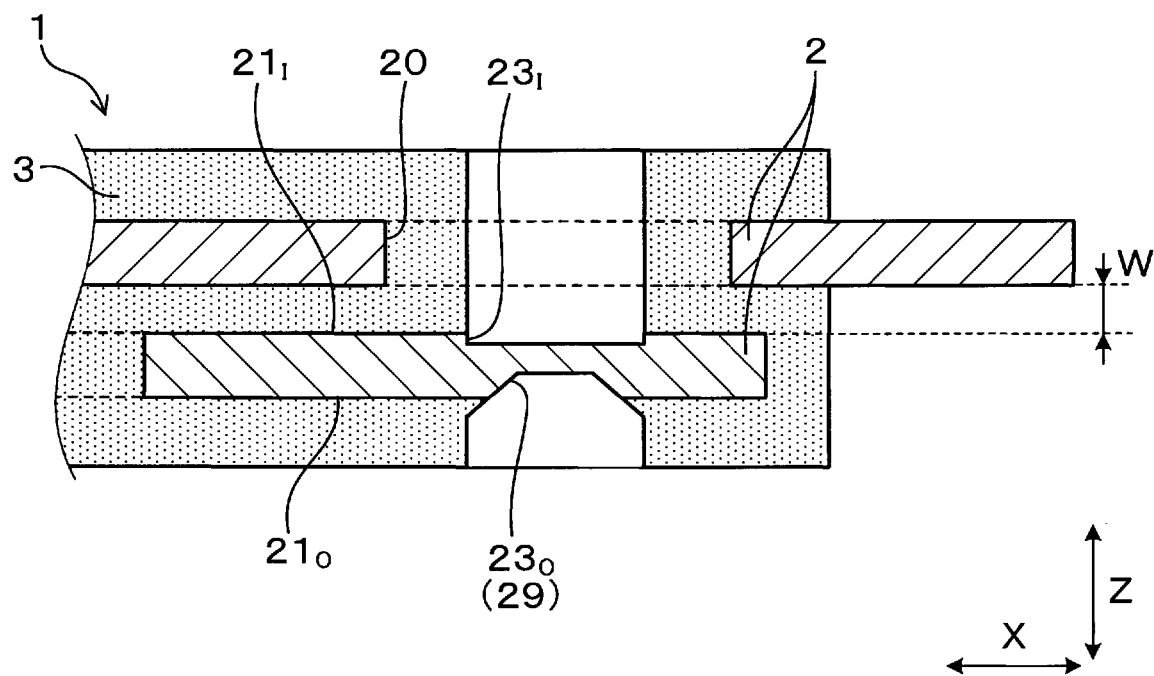
FIG. 17 is a partially enlarged view of FIG. 16.

After the accommodation step is performed, a resin 30 is injected into the die 5 to seal the conductive members 2. FIGS. 16 and 17 show cross-sectional views of the produced conductive member module 1. As shown in these figures, the outer recesses $23_O$ and the inner recesses $23_I$ formed in the accommodation step remain in the conductive members 2.

The working effects of the present embodiment will be described. In the present embodiment, the outer recesses $23_O$ each have an inner peripheral surface 29 that is inclined so as to approach the center of the outer recess $23_O$ toward the inner surface $21_I$ side in the Z direction. That is, in the present embodiment, the outer recess $23_O$ is formed using the outer support member $4_O$ with a tapered tip 42. This makes it possible to form a deep outer recess $23_O$ using the tip 42 while increasing the thickness of the main part 41 of the outer support member $4_O$ (see FIG. 18). This can suppress the problem that the outer support members $4_O$ are broken or bent in the accommodation step. Moreover, in the present embodiment, the amount of recess of the outer recesses $23_O$ can be increased, similarly to the first embodiment. Therefore, even if the thickness of the conductive member 2 varies, the variation of the thickness can be absorbed by the outer recesses $23_O$, and the significant variation of the distance W between the pair of conductive members 2 can be suppressed.

In addition, the present embodiment has the same configurations and working effects as those of first embodiment.

Figure 19:
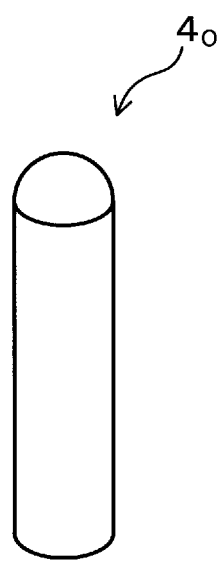
FIG. 19 is a perspective view of a support member with a hemispherical tip in the second embodiment.

In the present embodiment, the tip 42 of each outer support member $4_O$ is formed in a truncated cone shape, as shown in FIG. 18; however, the present disclosure is not limited thereto. That is, for example, the tip 42 of each outer support member $4_O$ may be formed in a hemispherical shape, as shown in FIG. 19.

Third Embodiment

Figure 23:
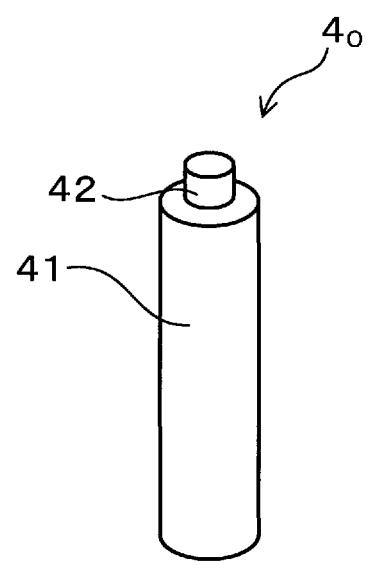
FIG. 23 is a perspective view of a support member in the third embodiment.

The present embodiment is an example in which the shape of the outer support members $4_O$ is changed. As shown in FIG. 23, the outer support members $4_O$ of the present embodiment each comprise a main part 41 and a tip 42. The main part 41 and the tip 42 are each formed in a cylindrical shape. The tip 42 has a smaller diameter than that of the main part 41.

Figure 20:
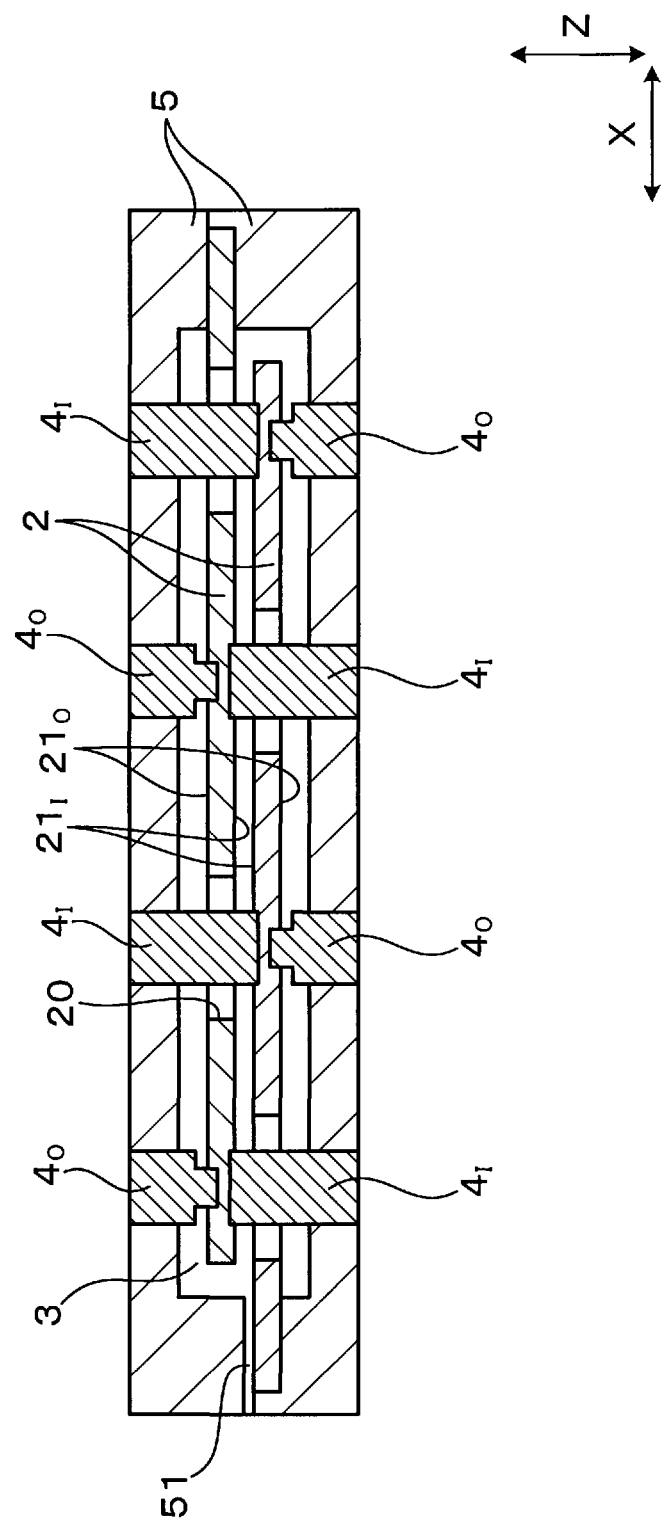
FIG. 20 is an explanatory view of a method for producing a conductive member module in a third embodiment.

As shown in FIG. 20, in the accommodation step, the conductive members 2 are sandwiched in the Z direction using the outer support members $4_O$ and inner support members $4_I$. Outer recesses $23_O$ are formed by the outer support members $4_O$, and inner recesses $23_I$ are formed by the inner support members $4_I$. In the present embodiment, the tip 42 of the outer support member $4_O$ (see FIG. 23) has a smaller diameter than that of the main part 41; thus, a higher pressure is applied to the outer surfaces $21_O$ of the conductive members 2 than to the inner surfaces $21_I$ thereof. Therefore, the outer recesses $23_O$ are deeper in the Z direction than the inner recesses $23_I$.

Figure 21:
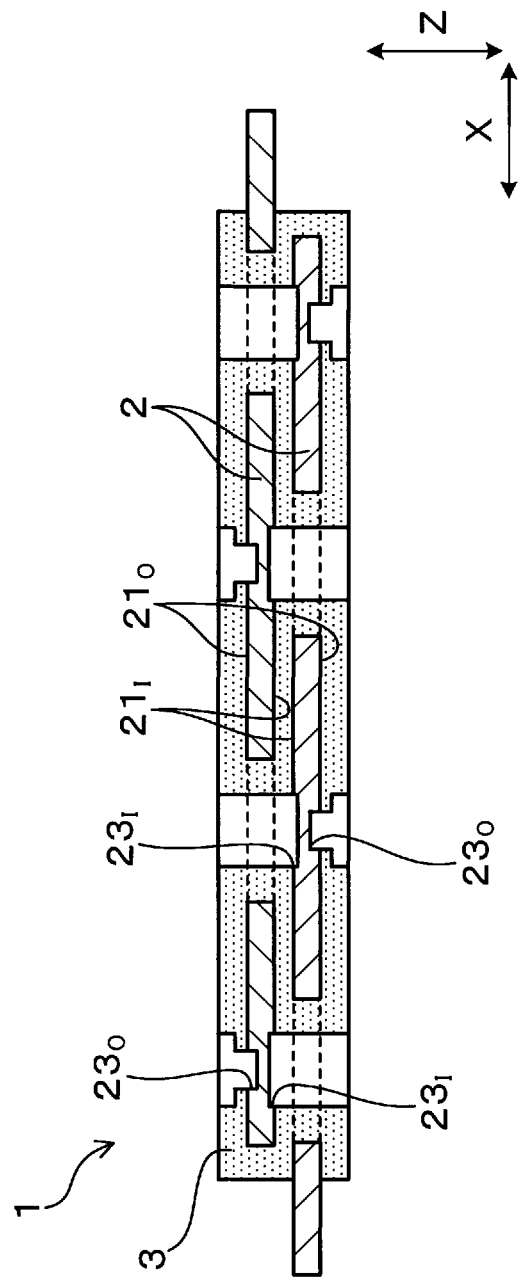
FIG. 21 is a cross-sectional view of the conductive member module in the third embodiment.
Figure 22:
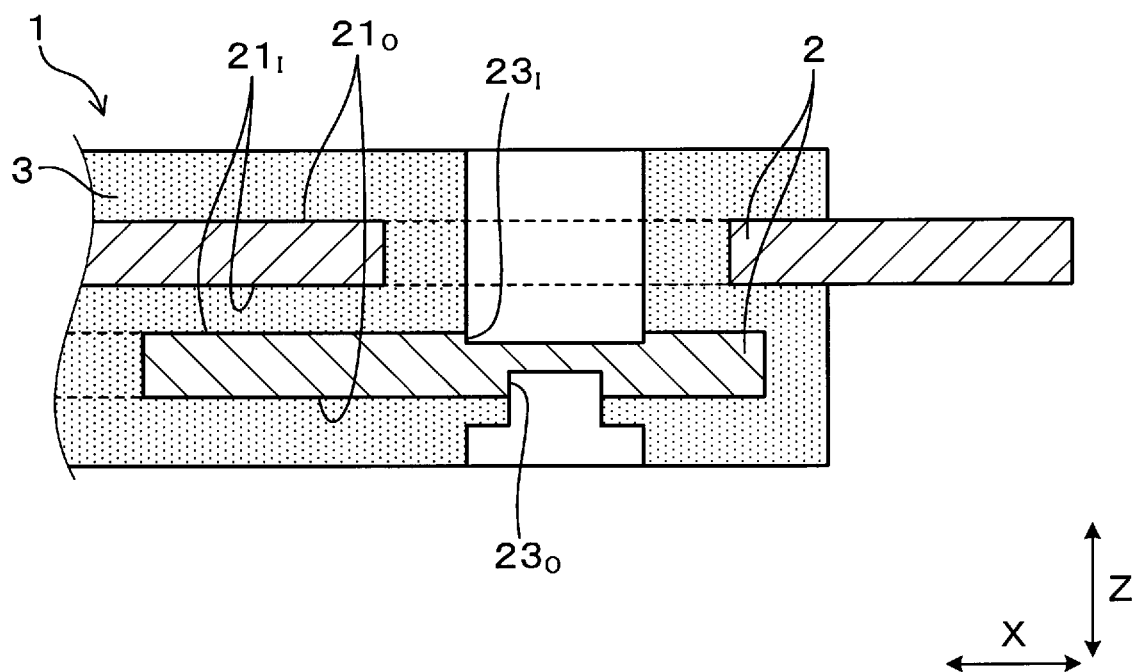
FIG. 22 is a partially enlarged view of FIG. 21.

After the accommodation step is performed, a resin 30 is injected into the die 5 to seal the conductive members 2. FIGS. 21 and 22 show cross-sectional views of the produced conductive member module 1. As shown in these figures, the outer recesses $23_O$ and the inner recesses $23_I$ formed in the accommodation step remain in the conductive members 2.

The working effects of the present embodiment will be described. In the present embodiment, the tip 42 of each outer support member $4_O$ has a smaller diameter than that of the main part 41. This makes it possible to form a deep outer recess $23_O$ using the tip 42 with a smaller diameter while increasing the thickness of the main part 41 of the outer support member $4_O$ (see FIG. 23). This can suppress the problem that the outer support members $4_O$ are broken or bent in the accommodation step. Moreover, in the present embodiment, the amount of recess of the outer recesses $23_O$ can be increased, similarly to the first embodiment. Therefore, even if the thickness of the conductive members 2 varies, the variation of the thickness can be absorbed by the outer recesses $23_O$, and significant variation of the distance W between the pair of conductive members 2 can be suppressed.

In addition, the present embodiment has the same configurations and working effects as those of first embodiment.

Fourth Embodiment

Figure 24:
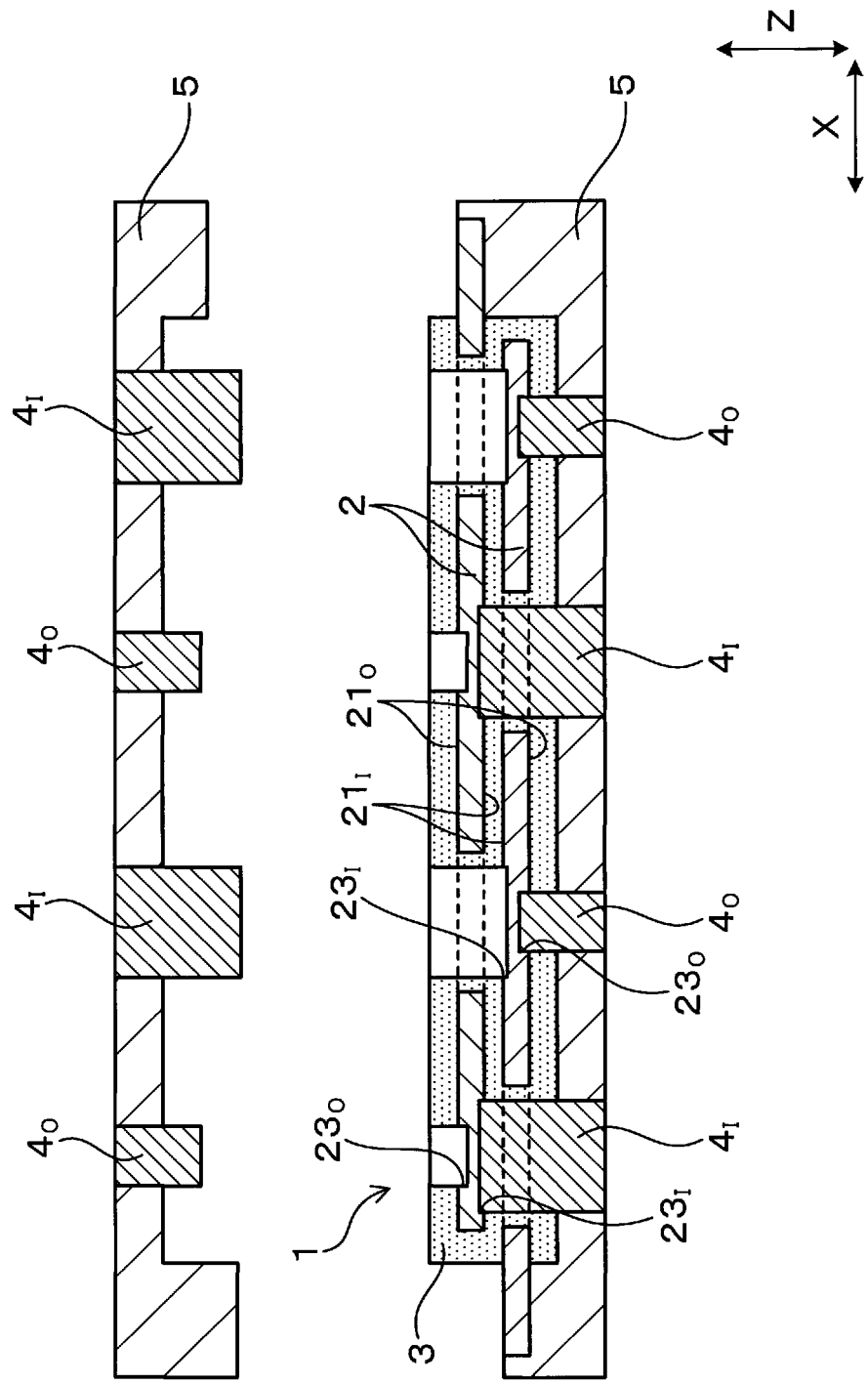
FIG. 24 is an explanatory view of a method for producing a conductive member module in a fourth embodiment.
Figure 25:
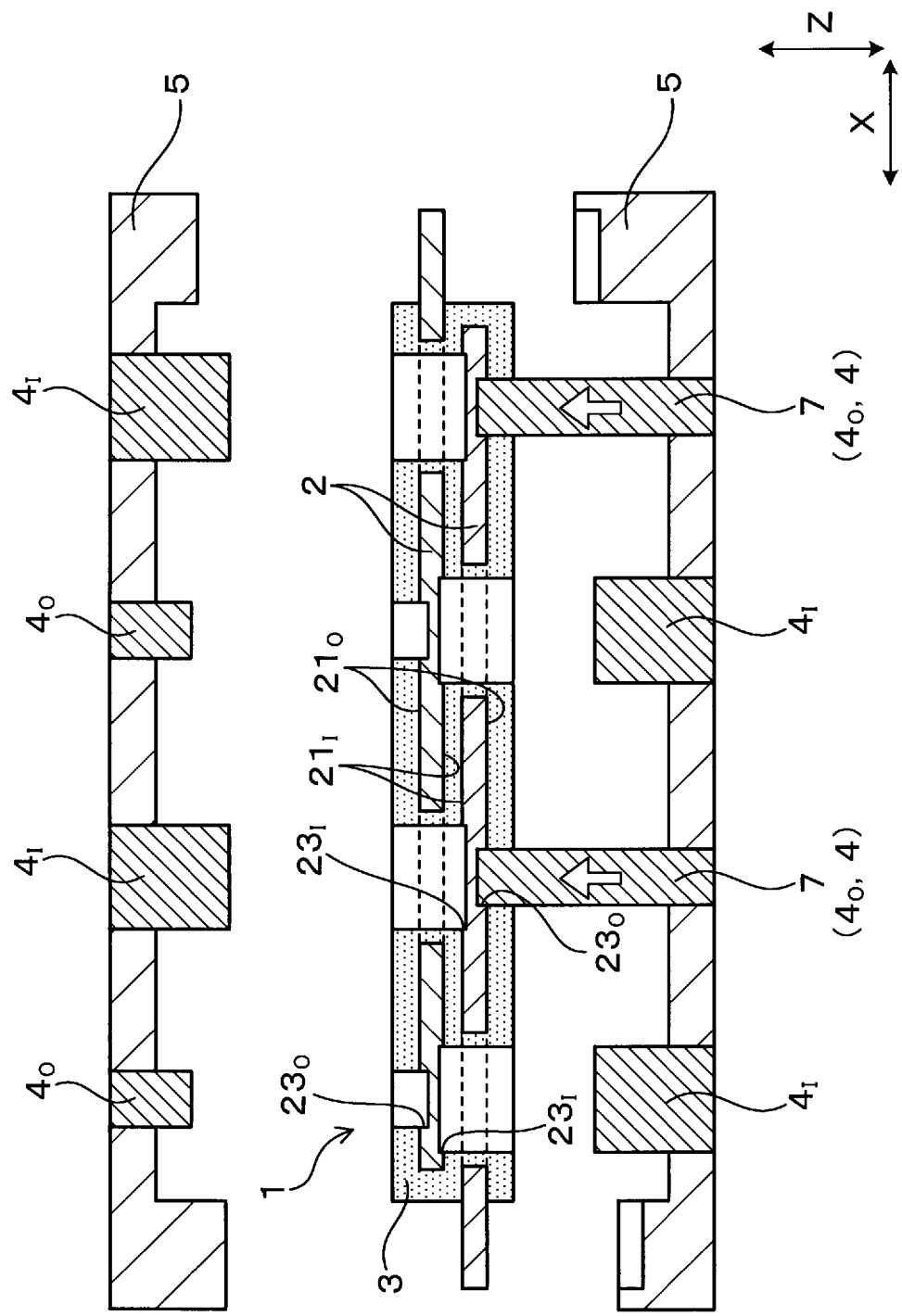
FIG. 25 is an explanatory view of the production method following FIG. 24.

The present embodiment is an example in which the extraction step is changed. As shown in FIG. 24, in the present embodiment, the die 5 is first opened in the extraction step. Thereafter, as shown in FIG. 25, some of the support members 4 (outer support members $4_O$ in the present embodiment) are pushed out, and the conductive member module 1 is released from the die 5.

Thus, in the present embodiment, the support members 4 are used as release pins 7.

The working effects of the present embodiment will be described. As described above, the support members 4 are used as the release pins 7 in the present embodiment. Therefore, it is not necessary to provide dedicated release pins 7, and the number of components can be reduced.

Moreover, in the present embodiment, the outer support members $4_O$ are used as the release pins 7. As shown in FIG. 25, the outer support members $4_O$ have a shallower depth in the Z direction inserted into the conductive member module 1 than the inner support members $4_I$. Therefore, less friction occurs between the outer support members $4_O$ and the sealing part 3 or the conductive members 2, and the conductive member module 1 can be easily removed from the outer support members $4_O$.

In addition, the present embodiment has the same configurations and working effects as those of first embodiment.

In the present embodiment, the outer support members $4_O$ are used as the release pins 7; however, the present disclosure is not limited thereto. That is, for example, the inner support members $4_I$ may be used as the release pins 7. Further, the inner support members $4_I$ and the outer support members $4_O$ both may be used as the release pins 7.

The present disclosure is described according to embodiments; however, it is understood that the present disclosure is not limited to the embodiments and configurations. The present disclosure also includes various modified examples and modifications within an equivalent range. In addition, various combinations and configurations, and other combinations and configurations including more, less, or only a single element, are also within the spirit and scope of the present disclosure.

CONCLUSION

The present disclosure is to provide a conductive member module in which the distance between a pair of conductive members is less likely to vary even if the thickness of the conductive members varies, and to also provide a method for producing the same.

A first aspect of the present disclosure is a method for producing a conductive member module having a pair of conductive members formed in a plate shape and facing each other, and a sealing part for sealing the pair of conductive members, the method comprising performing:

an accommodation step of accommodating the pair of conductive members in a molding die in a state of being separated from each other, a sealing step of injecting a fluid resin into the die to seal the pair of conductive members, and an extraction step of extracting the conductive member module from the die.

In the accommodation step, the individual conductive members are held in the die while they are sandwiched in a facing orientation of the pair of conductive members by outer support members abutting outer surfaces of the conductive members in the facing orientation, and inner support members abutting inner surfaces of the conductive members in the facing orientation, outer recesses are formed in the outer surfaces by the outer support members, inner recesses are formed in the inner surfaces by the inner support members, and the outer recesses are deeper in the facing orientation than the inner recesses.

Further, a second aspect of the present disclosure is a conductive member module includes:

a pair of conductive members formed in a plate shape and facing each other, a sealing part made of a resin and sealing the pair of conductive members, outer recesses formed in outer surfaces of the conductive members in a facing orientation of the pair of conductive members, and recessed in the facing orientation, inner recesses formed in inner surfaces of the conductive members in the facing orientation, and recessed in the facing orientation, outer through holes penetrating part of the sealing part in the facing orientation and connected to the outer recesses from opening sides, and inner through holes penetrating part of the sealing part in the facing orientation and connected to the inner recesses from opening sides.

The outer recesses are deeper in the facing orientation than the inner recesses.

In the method for producing a conductive member module, the individual conductive members are sandwiched in the facing orientation using the outer support members and the inner support members in the accommodation step. The outer recesses are formed in the outer surfaces of the conductive members by the outer support members, and the inner recesses are formed in the inner surfaces of the conductive members by the inner support members. The outer recesses are deeper in the facing orientation than the inner recesses.

Accordingly, even if production variations occur in the thickness of the conductive members, the variation of the thickness can be absorbed by the outer recesses. Therefore, the distance between the pair of conductive members is less likely to vary significantly.

Consequently, the variation of the parasitic inductance between the pair of conductive members can be reduced.

Further, in the conductive member module, the outer recesses are also deeper in the facing orientation than the inner recesses.

Accordingly, even if production variations occur in the thickness of the conductive members, the variation of the thickness can be absorbed by the outer recesses. Therefore, the large variation of the distance between the pair of conductive members can be suppressed. Consequently, the variation of the parasitic inductance between the pair of conductive members can be reduced.

As described above, these aspects make it possible to provide a conductive member module in which the distance between a pair of conductive members is less likely to vary even if the thickness of the conductive members varies, and to also provide a method for producing the same.

What is claimed is:

1. A method for producing a conductive member module having a pair of conductive members formed in a plate shape and facing each other, and a sealing part for sealing the pair of conductive members, the method comprising performing:

an accommodation step of accommodating the pair of conductive members in a molding die in a state of being separated from each other, a sealing step of injecting a fluid resin into the die to seal the pair of conductive members, and an extraction step of extracting the conductive member module from the die;

wherein in the accommodation step, the individual conductive members are held in the die while they are sandwiched in a facing orientation of the pair of conductive members by outer support members abutting outer surfaces of the conductive members in the facing orientation, and inner support members abutting inner surfaces of the conductive members in the facing orientation, outer recesses are formed in the outer surfaces by the outer support members, inner recesses are formed in the inner surfaces by the inner support members, the outer recesses are deeper in the facing orientation than the inner recesses, and the outer recesses have a smaller area when viewed from the facing orientation than that of the inner recesses.

2. The method for producing a conductive member module according to claim 1, wherein the outer recesses each have an inner peripheral surface that is inclined so as to approach the center of the outer recess toward the inner surface side in the facing orientation.

3. The method for producing a conductive member module according to claim 1, wherein the outer support members and the inner support members are formed separately from the die.

4. The method for producing a conductive member module according to claim 3, wherein at least either the outer support members or the inner support members also serve as release pins for releasing the conductive member module from the die in the extraction step.

\* \* \* \* \*